(12) United States Patent
Krauch et al.

(10) Patent No.: US 7,401,312 B2
(45) Date of Patent: Jul. 15, 2008

(54) AUTOMATIC METHOD FOR ROUTING AND DESIGNING AN LSI

(75) Inventors: Ulrich Krauch, Dettenhausen (DE); Juergen Pille, Stuttgart (DE); Tobias Werner, Weil im Schoenbuch (DE); Alexander Woerner, Bocbingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/983,819

(22) Filed: Nov. 8, 2004

(65) Prior Publication Data
US 2005/0132319 A1 Jun. 16, 2005

(30) Foreign Application Priority Data
Dec. 11, 2003 (EP) .................. 03104166

(51) Int. Cl.
*G06F 17/50* (2006.01)
*G06F 9/455* (2006.01)
(52) U.S. Cl. ........................... 716/12; 716/11
(58) Field of Classification Search .............. 716/11–14
See application file for complete search history.

(56) References Cited

U.S. PATENT DOCUMENTS

| | | | |
|---|---|---|---|
| 4,831,543 A * | 5/1989 | Mastellone | 716/2 |
| 6,324,675 B1 * | 11/2001 | Dutta et al. | 716/13 |
| 6,330,707 B1 | 12/2001 | Shinomiya et al. | 716/14 |
| 6,349,403 B1 * | 2/2002 | Dutta et al. | 716/12 |
| 6,415,426 B1 * | 7/2002 | Chang et al. | 716/9 |
| 6,668,360 B1 * | 12/2003 | Liu | 716/4 |
| 2003/0088843 A1 * | 5/2003 | Mehrotra et al. | 716/12 |
| 2003/0188268 A1 * | 10/2003 | Konstadinidis et al. | 716/2 |

* cited by examiner

*Primary Examiner*—Jack Chiang
*Assistant Examiner*—Suresh Memula
(74) *Attorney, Agent, or Firm*—Lynn L. Augspurger

(57) ABSTRACT

According to the present invention an automated method is provided for routing and designing an LSI (Large Scale Integrated Circuit). First, at least one generic of an instance of a book to be connected is located on the chip, wherein a generic of an instance is an area defined according to the measurements of said instance. Then, an initial route to said instance is generated by optimizing the route to the corresponding generic according to given design rules. Thereby, an optimized pin location is determined for said instance. Then, on the basis of said optimized pin location a layout for said instance is generated in place of the corresponding generic. Finally, the actually generated pin is connected with the corresponding end of the initial route.

7 Claims, 2 Drawing Sheets

AUTOMATIC METHOD FOR ROUTING AND DESIGNING AN LSI

BACKGROUND OF THE INVENTION

The present invention relates in general to an automated method utilized for routing and designing an LSI. More particularly, the present invention relates to a method which considers and uses interdependencies between routing and designing of the instances of books to be routed. Specifically, the present invention relates to a routing method which provides design parameters for the layout of the instances to optimize the density of the circuits and wiring on the chip overall.

Besides, the present invention relates to a wiring tool for routing the instances of the books of an LSI and to a layout generator for creating the layout of the instances of the books of an LSI, which are especially designed to carry out an automated method for routing and designing an LSI according to the present invention.

1. Description of the Related Art

The growing complexity of integrated circuits is limited by the density of local wiring but not by the density of silicon used for circuits. If the area used for circuits exceeds about 60% of the chip area it becomes very difficult if not impossible to connect these circuits. So any increase of the wiring density will increase the density of the circuits on the chip overall.

State of the art is that the instances of the circuits or books placed on a chip are fully designed and have static pin locations. To interconnect the corresponding pins, a wiring tool or a circuit designer manually retrieves the pin locations and routes the wires according to free wiring channels. If a conflict-free wiring within one wiring level is not possible, the wiring tool changes the wiring layer by using vias to connect all corresponding pins. Vias are small vertical connectors between wiring layers and thus critical I manufacturing. Each via needs to have a certain distance to the next via which is higher than the required distance between two wires. As vias are one of the main yield limiting factors of a design, it is often mandatory to add redundant vias to increase the overall yield. In these cases the via spacing rule becomes more important and more chip area is needed to allow the wiring. In a full custom design it is also possible to duplicate the book under a different name and modify the pin locations in the copy manually.

U.S. Pat. No. 6,440,707 describes an automated method for routing and designing an LSI in which, first, an initial routing is performed on a net. If a design rule error exists in a wire already routed as a result of initial routing, said wire is removed. Next, the terminals of the removed wire are examined whether they are movable, which means freely placeable within a predetermined region of the design of the instances to be connected. If at least one of said terminals is movable, it is displaced within the predetermined region and the removed wire is re-routed such that the displaced movable terminal is interconnected to the other terminal. Thus, the movable terminal can be located at an appropriate position within the predetermined region in accordance with the situation of surrounding wires.

The routing method disclosed in U.S. Pat. No. 6,440,707 is based on fully designed instances of books to be routed. A "book" is herein defined as a switching element (transistor etc) or a logical unit (gate, latch like XOR or NAND gates) based on which a circuit design can be generated. A designed circuit insofar represents a library consisting of a multitude of books. The pin locations are either static, which means fixed, or movable which means the pin location can vary as long as it is placed within a defined region of the fully designed instance. For initial routing the movable pin locations are set according to design rules which have to consider the given layout of the instances. Only if a design rule error occurs after initial routing the possibility of displacing the already existing pins will be considered.

Object of the Invention

Starting from this, the object of the present invention is to provide an automated method for routing and designing an LSI which allows a further increase of the wiring density and thus a further increase of the density of the circuits on the chip overall. Besides, the present invention provides a wiring tool and a layout generator which are especially designed to carry out the method according to the present invention.

BRIEF SUMMARY OF THE INVENTION

The foregoing objects are achieved by a method and a wiring tool and a layout generator as laid out in the independent claims. Further advantageous embodiments of the present invention are described in the subclaims and are taught in the following description.

According to the present invention a method is provided for routing and designing an LSI (Large Scale Integrated Circuit), which uses so called generics of the instances of books to be located and connected on the chip. A generic of an instance represents an area defined according to the measurements of said instance. First, generics of the instances to be connected are located on the chip. Then, an initial route between said instances is generated by optimizing the route between the corresponding generics according to given design rules. Thereby, it is possible to determine optimized pin locations for said instances. Only then, by considering said optimized pin locations, a layout for each of said instances is generated in place of the corresponding generics. Finally, the actually generated pins are connected with the corresponding ends of the initial route.

This approach of routing and designing an LSI is based on the idea of an automatic interaction between the wiring tool and a generator. The layout generator creates a layout for an instance based on parameters obtained by the wiring tool especially for the individual wiring situation of said instance. Thus, multiple instances of the same book can have different parameter settings, especially different pin locations, and different layout appearances.

As a consequence in a custom design environment, there is no need to copy and modify the original book if a different pin location is desired for another instance of a book. Also, it is not necessary to maintain multiple copies of the same book with only minor differences. As only one book needs to be designed and maintained, the design time can be reduced as well as the data volume of the design data.

In an ASIC design environment where it is not possible to copy and manually modify the common books, the method proposed by the invention simplifies the wiring situation and therefore reduces the complexity of the wiring needed in several different aspects. One aspect is that the method according to the present invention uses less wiring tracks to make all necessary connections. Besides, if pins can be switched per instance, potentially more wires can be routed straight to their pins. Another aspect is that the number of required wiring layers is reduced and therefore the number of vias, which imply via spacing design rules. Each of these aspects contributes to an increase of wiring density and thus of the density of the circuits on the chip overall.

The integration of more circuits on the same chip size will lead to a higher functionality of the chips, on the one hand. On the other hand, an increase of chip density may reducer the chip size which implies reduced manufacturing costs due to higher yield since there is a constant number of defects per wafer area. Also, a reduced number of vias on the chip will lead to a higher yield, as vias are one of the main yield limiting factors of a design.

A mixed design environment with custom and ASIC elements combines the advantages mentioned above.

As mentioned above the initial route between two instances is generated by considering given design rules. In an advantageous embodiment of the present invention the following design rules are considered:

minimum/maximum width and spacing of wires;
the length of the initial route should be as short as possible,
the position of the initial route should be available in one layer,
the initial route is positioned in a predetermined layer. In this context it should be mentioned that it is also possible to consider less, more or different design rules by generating an initial route without leaving the scope of protection of the claimed invention.

The particular steps of the automatic method for routing and designing an LSI proposed by the present invention can be carried out by different tools of a computer system. In an advantageous embodiment of the present invention a wiring tool generates the initial route, determines the optimized pin location of an instance and passes the coordinates of said optimized pin location to a layout generator. Then this layout generator can create the layout of said instance by considering the optimized pin location determined by the wiring tool.

The connection between the actually generated pins of the instances and the corresponding ends of the initial route can be generated by the layout generator. In this case the layout generator has to create a layout for the area of the instances and besides a layout for a frame area surrounding the area of the instances and touching or including the corresponding ends of the initial route. Here, the layout generator uses the information about the optimized pin locations received from the wiring tool once for creating a layout of the instances and again for the final routing of the actually generated pins.

In another embodiment of the present invention the wiring tool connects the actually generated pins with the corresponding ends of the initial route. Therefore, the layout generator has to pass the coordinates of the actually generated pins to the wiring tool. Only then, the wiring tool is able to generate the connections necessary.

BRIEF DESCRIPTION OF THE DRAWINGS

The above, as well as additional objectives, features and advantages of the present invention, will be apparent in the following detailed description of an illustrative embodiment when read in conjunction with the accompanying drawings, wherein:

FIG. 1b shows two instances of books to be routed and designed at consecutive states of processing which correspond to the steps illustrated in FIG. 1a.

DETAILED DESCRIPTION OF THE INVENTION

Figure 1A:
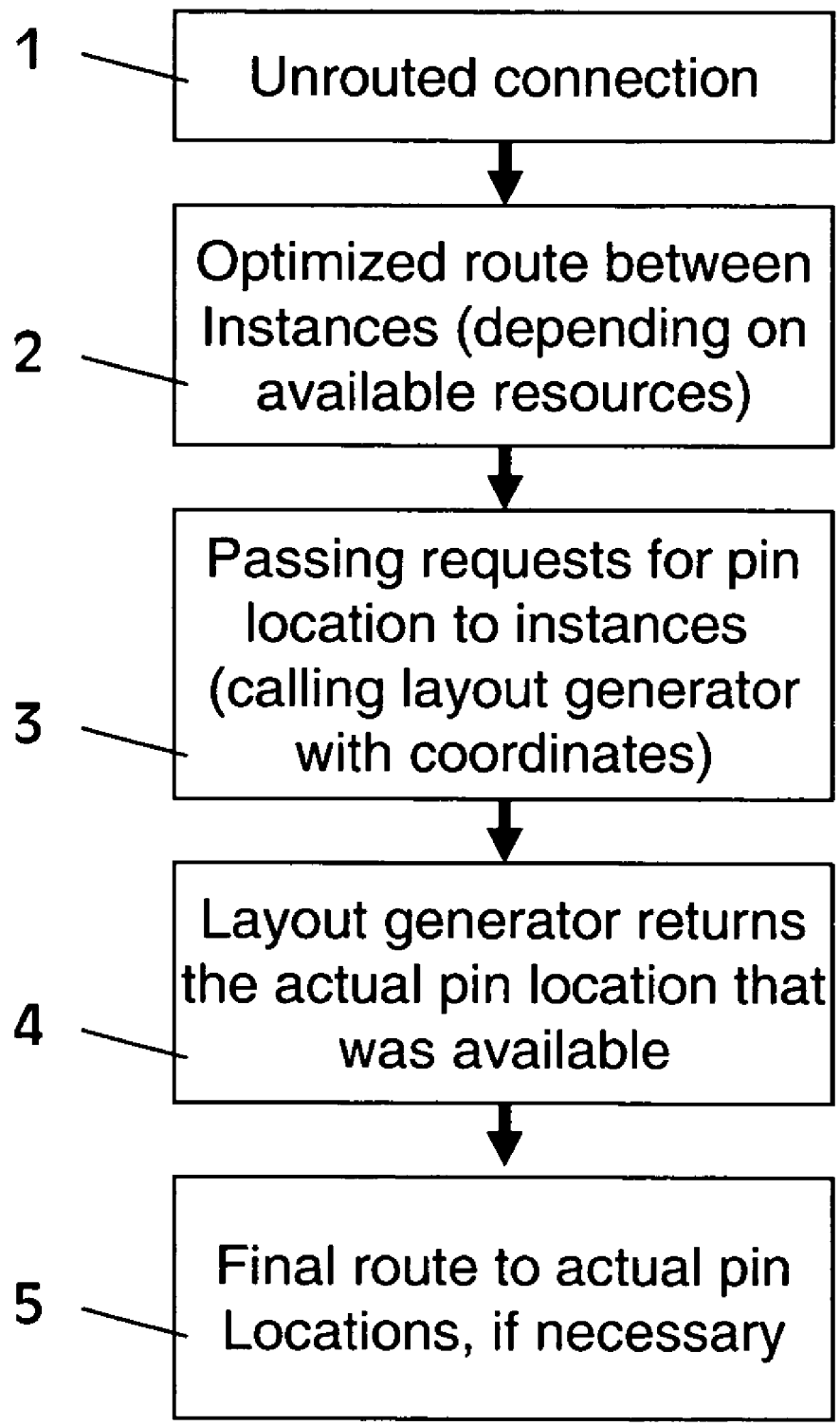
FIG. 1a shows a flow chart illustrating the particular steps of an automated method for routing and designing an LSI according to the present invention.

In the hereinafter described example the processing of an LSI starts with the location of the instances of books to be connected. As these instances are not yet fully designed they are called generics in terms of the present invention. A generic of an instance represents an area on the chip where this instance shall be created during processing. Therefore, the area of a generic is defined according to the measurements of the corresponding instance. In step 1 of the flow chart of FIG. 1a the generics of two instances 10 and 11 are located on the chip. The connection between these instances 10 and 11 is not yet routed.

In the next step 2 an initial route 12 is generated between said instances 10 and 11 by a wiring tool. Therefore, the route between the corresponding generics is optimized according to the following design rules. The minimum/maximum width and spacing of wires has to be considered. The length of the initial route should be as short as possible. Besides, the position of the initial route should be available in one, here predetermined layer. The layer for wiring can be determined e.g. to optimize the performance of the net generated. As in this layer a blockage 13 is located between the instances 10 and 11, a straight connection between the instances 10 and 11 is not possible. Thus, the initial route 12 detours the blockade 13.

Figure 1B:
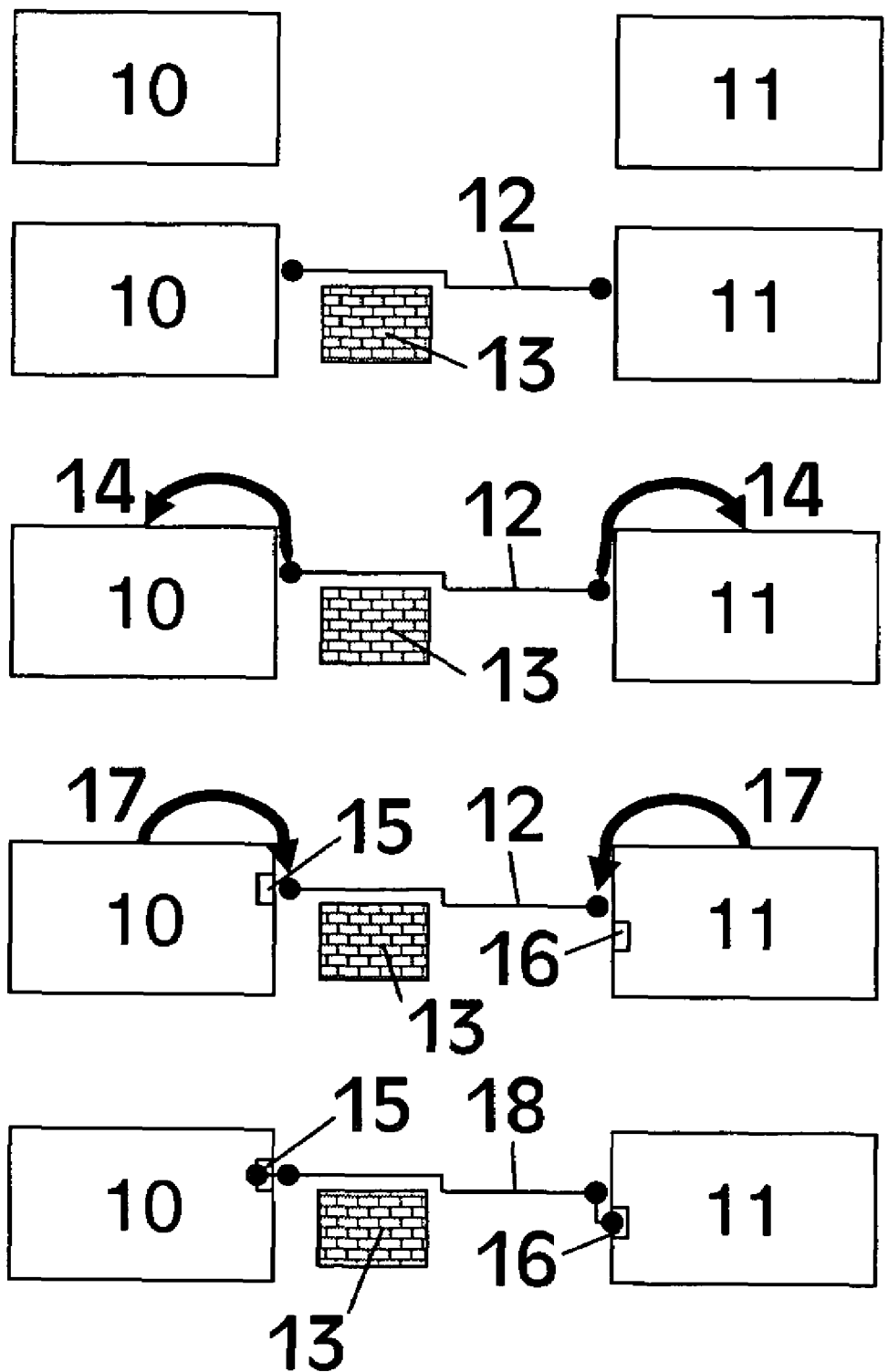

On the base of the position and layout of the generated initial route 12 it is now possible to determine an optimized pin location for each of the instances 10 and 11. In step 3 the coordinates of these optimized pin locations are passed to a layout generator together with a request for corresponding pin locations to the instances. This is indicated by the arrows 14 in FIG. 1b.

Then, the layout generator creates the layout for each of the instances 10 and 11 in place of the corresponding generics by considering the corresponding optimized pin location. In case of instance 10, the pin 15 could be created at the desired location. In case of instance 11, the desired pin location was not available. Pin 16 had to be created a little bit displaced to this desired location. The rest of the layout of the instances 10 and 11 is created and aligned as is state of the art.

In step 4 the layout generator returns the actual pin locations that were available to the wiring tool, what is indicated by the arrows 17.

In step 5 the wiring tool does the final route 18 to the actual pin locations which means connecting the actually generated pins 15 and 16 with the corresponding ends of the initial route 12.

As the actual wiring length can easily be determined by the wiring tool used according t the present invention the driver of the so generated net can automatically be adapted to the chosen wiring solution.

As described above, the idea of the invention is that pin locations are dynamic and can be set according to the placement and wiring situation. This can be achieved by layout generators that can handle a set of parameters and create a layout on the fly.

The invention claimed is:

1. An automated method for routing and designing an LSI (Large Scale Integrated Circuit), the method comprising the steps of:

modifying the layout of a plurality of circuit instances individually during the routing and designing of said LSI by:

a) locating at least one generic of an instance to be connected of a circuit design book providing switching elements and logic units based on which a circuit design can be generated, wherein a generic is an area defined according to the measurements of the size of the area of said instance of said circuit design book;

b) generating an initial route to said instance by optimizing a route to a corresponding generic according to given design rules;

c) determining an optimized pin location for said instance;

d) generating a layout for said instance in place of said corresponding generic by considering said optimized pin location;

e) connecting a layout generated pin with a corresponding end of the initial route.

2. The method according to claim 1, where instances oft at least two of said circuit design books are to be connected, the method comprising the steps of:

a) locating generics of the instances to be connected;

b) generating an initial route between said instances by optimizing the route between corresponding generics of said instances to be connected located according to step (a) according to given design rules;

c) determining an optimized pin location for each of said instances;

d) generating a layout for each of said instances in place of said corresponding generics by considering the corresponding optimized pin location for each of said instances;

e) connecting layout generated pins with the corresponding ends of said initial route.

3. The method according to claim 1 wherein the following design rules are considered by generating an initial route:

minimum/maximum width and spacing of wires are considered;

said initial route should be made as short as possible;

said initial route should be available and positioned in one layer;

and said initial route is positioned in a predetermined layer.

4. The method according to claim 1 wherein a wiring tool generates said initial route to said instance, determines the optimized pin location for an instance and passes coordinates for said optimized pin location to a layout generator.

5. The method according to claim 4 wherein said layout generator creates the layout of said instance by considering the optimized pin location determined by said wiring tool.

6. The method according to claim 5 wherein said layout generator connects the actually generated pin with the corresponding end of said initial route.

7. The method according to claim 4, wherein said layout generator passes the coordinates of the actually generated pin to said wiring tool and wherein said wiring tool connects the actually generated pin with the corresponding end of said initial route.

* * * * *